(12) United States Patent
Oshika et al.

(10) Patent No.: US 8,747,579 B2
(45) Date of Patent: *Jun. 10, 2014

(54) SOLDER LAYER AND DEVICE BONDING SUBSTRATE USING THE SAME AND METHOD FOR MANUFACTURING SUCH A SUBSTRATE

(75) Inventors: Yoshikazu Oshika, Chiyoda-ku (JP);
Munenori Hashimoto, Chiyoda-ku (JP);
Masayuki Nakano, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 1063 days.

This patent is subject to a terminal disclaimer.

(21) Appl. No.: 12/037,958

(22) Filed: Feb. 27, 2008

(65) Prior Publication Data

US 2008/0205013 A1    Aug. 28, 2008

(30) Foreign Application Priority Data

Feb. 27, 2007 (JP) .................................. 2007-48170

(51) Int. Cl.
*C22F 1/14*    (2006.01)

(52) U.S. Cl.
USPC ......................................... 148/678; 428/209

(58) Field of Classification Search
USPC ............ 205/247; 257/772; 148/678; 428/209
See application file for complete search history.

(56) References Cited

U.S. PATENT DOCUMENTS

| | | | |
|---|---|---|---|
| 3,725,144 A | 4/1973 | Harvey | |
| 5,197,654 A | 3/1993 | Katz et al. | |
| 5,854,087 A | 12/1998 | Kurata | |
| 5,990,560 A | 11/1999 | Coult et al. | |
| 6,124,635 A | 9/2000 | Kuwabara | |
| 6,383,923 B1 | 5/2002 | Brown et al. | |
| 6,927,492 B2 | 8/2005 | Dautartas | |

(Continued)

FOREIGN PATENT DOCUMENTS

| | | |
|---|---|---|
| EP | 0 542 475 A1 | 5/1993 |
| EP | 0 911 111 A2 | 4/1999 |

(Continued)

OTHER PUBLICATIONS

Ishii et al. "Fluxless Fabrications of Sn-Au Solder Microbumps by a Hydrogen Plasma Reflow Technique", Journal of Electronic Materials, vol. 34, No. 5, 2005, pp. 630-634.*

(Continued)

*Primary Examiner* — Weiping Zhu
(74) *Attorney, Agent, or Firm* — Chen Yoshimura LLP

(57) ABSTRACT

A solder layer and an electronic device bonding substrate having high bonding strength of a device and low bonding failure even by a simplified bonding method of a device to a substrate and a method for manufacturing the same are provided.

A device bonding substrate 1 including a substrate 2 and a lead free solder layer 5 formed on said substrate has a solder layer 5 consisting of a plurality of layers having mutually different phases, and oxygen concentration on the upper surface of the solder layer is lower than 30 atomic % of the concentration of the metal component which is the most oxidizable among the metal components making up the upper layer of the solder layer 5. Carbon concentration on the upper surface of the solder layer 5 may be lower than 10 atomic % of the concentration of the metal component which is the most oxidizable among the metal components making up the upper layer of the solder layer.

6 Claims, 18 Drawing Sheets

(56) References Cited

U.S. PATENT DOCUMENTS

| | | | |
|---|---|---|---|
| 7,009,299 | B2 | 3/2006 | Angst et al. |
| 2003/0134142 | A1 | 7/2003 | Ivey et al. |
| 2005/0127147 | A1 | 6/2005 | Kao et al. |
| 2005/0212140 | A1 | 9/2005 | Fujinaga et al. |
| 2007/0246829 | A1 | 10/2007 | Yamane et al. |
| 2009/0207580 | A1 | 8/2009 | Oshika et al. |

FOREIGN PATENT DOCUMENTS

| | | | |
|---|---|---|---|
| EP | 1 002 612 A1 | | 5/2000 |
| JP | 06-069608 A | | 3/1994 |
| JP | 2762007 B2 | | 3/1998 |
| JP | 10-270613 A | | 10/1998 |
| JP | 3156798 B2 | | 2/2001 |
| JP | 2002-224882 A | | 8/2002 |
| JP | 2002224882 A | * | 8/2002 |
| JP | 2004-111607 A | | 4/2004 |
| JP | 2005-285882 A | | 10/2005 |
| WO | 2004/042819 A1 | | 5/2004 |
| WO | 2006/098454 A1 | | 9/2006 |

OTHER PUBLICATIONS

Simic, et al. "Thin film interdiffusion of Au and Sn at room temperature", Journal of the Less-Common Metals, 51, pp. 177-179, 1977 Mentioned on p. 2 of the as-filed translation of the specification.

Kuang, et al. "Effect of Temperature Cycling on Joint Strength of PbSn and AuSn Solders in Laser Packages", IEEE Transactions on Advanced Packaging, vol. 24, No. 4, pp. 563-568, Nov. 2001 Mentioned on p. 2 of the as-filed translation of the specification.

Yamaguchi, et al. "Study on Au/Sn micro soldering method applied for fine pitch multilayer lead frame used for quad flat LSI package", Abstracts of National Meeting of Japan Welding Society, vol. 49, pp. 410-411, Sep. 1991 Mentioned on p. 2 of the as-filed translation of the specification as concise explanation of relevance.

"Metal Databook", edited by The Japan Institute of Metals, Third Edition, Maruzen, Mar. 25, 1993, pp. 490-491 Mentioned on p. 2 of the as-filed translation of the specification as concise explanation of relevance.

Kubaschewski, et al., "Materials Thermochemistry", 6th Edition, Pergamon Press, pp. 258-311 (Table 1), 1993 Mentioned on p. 2 of the as-filed translation of the specification.

Kubaschewski, et al., "Metallurgical Thermochemistry", 5th Edition, Pergamon Press, pp. 268-313 (Table A), 1979 Mentioned on p. 2 of the as-filed translation of the specification.

Japanese Office Action dated on Jun. 21, 2011, in a counterpart Japanese patent application of Application No. 2007-048170. Concise explanation of relevance: The Japanese Office Action rejects claims in the Japanese application in view of Foreign Patent document Nos. 1-2 above.

Applicants bring the attention of the Examiner to the following pending U.S. Appl. No. 12/297,438, filed Oct. 16, 2008.

International Search Report (ISR) issued in PCT/JP2007/056740 (International application of the related U.S. Appl. No. 12/297,438 mentioned above) mailed in Apr. 2007 for Examiner consideration, citing U.S. Patent Nos. 1-2 and U.S. Patent application publication No. 1 and, Foreign Patent documents Nos. 3-6 listed above.

PCT/ISA/237 issued in PCT/JP2007/056740 (International application of the related U.S. Appl. No. 12/297,438 mentioned above) mailed in Apr. 2007and its English translation of Section V.

PCT/IB/338 and IB/373, and English translation of PCT/ISA/237of PCT/JP2007/056740 (International application of the related U.S. Appl. No. 12/297,438 mentioned above) mailed in Nov. 2008.

European Search Report dated Dec. 10, 2010, in a counterpart European patent application No. 07740178.4 of the related U.S. Appl. No. 12/297,438 mentioned above for Examiner consideration, citing U.S. Patent No. 3 and U.S. Patent application publication No. 1, and Foreign Patent document Nos. 7-10 listed above.

* cited by examiner (A)　　　　　　(B)　　　　　　(C)

(A)

(B)

SOLDER LAYER AND DEVICE BONDING SUBSTRATE USING THE SAME AND METHOD FOR MANUFACTURING SUCH A SUBSTRATE

TECHNICAL FIELD

The present invention relates to a solder layer used for electronic circuit substrates or others and a device bonding substrate using the same and a method for manufacturing such a substrate.

BACKGROUND ART

Various electronic parts are usually installed at a pre-determined position on a copper wiring pattern formed on a print substrate, and soldered to form an electronic circuit wiring. Conventional electronic circuits had electronic devices bonded on a print substrate made of paper phenol resin, epoxy resin, glass epoxy resin, or others using a solder layer containing Pb (lead) as a main component.

However, solders containing lead tend to be restricted from use in recent years for reducing environmental load. Especially in Europe, their use has been banned since Jul. 1, 2006 by the RoHS Directive (directive of the European Assembly and Directorate on restriction of the use of certain hazardous substances in electrical and electronic equipments). Consequently, lead free solders such as those formed of Au—Sn, Ag—Sn, In—Sn, Zn—Sn, and Bi—Sn have been proposed as alternatives of the lead and tin containing solder.

Nonpatent Reference 1 reports that, when a solder not containing lead is left at room temperature, it takes more than 10 months for equilibrium to be reached. Nonpatent Reference 2 reports that, when a load by a heat cycle is applied after solder bonding in a semiconductor laser package using a solder not containing lead, the strength of the solder bonding changes gradually due to said heat cycle load.

Nonpatent Reference 3 discloses a method to bond an electronic device to a substrate by contacting the device to a solder layer from the start of heating of the solder layer, pressing the device to the solder layer, and changing its pressure by the solder layer temperature. FIG. 17 is a phase diagram (See Nonpatent Reference 4.) illustrating the phases of an alloy consisting of Au and Sn (Au—Sn alloy) used in Nonpatent Reference 3 by atomic ratio.

[Nonpatent Reference 1] V. SIMIC and Z. MARINKOVIC, "Thin film interdiffusion of Au and Sn at room temperature", J. Less-Common Metals, 51, pp. 177-179, 1977
[Nonpatent Reference 2] J-H. Kuang and 5 others, "Effect of Temperature Cycling on Joint Strength of PbSn and AuSn Solders in Laser Packages", IEEE Trans., Adv. Pack, Vol. 24, No. 4, pp. 563-568, 2001
[Nonpatent Reference 3] Kenji YAMAGUCHI and 3 others, "Study of Au/Sn Bonding in Manufacture of Interpitch Multilayered Lead Frame (1)" (in Japanese), Abstracts of National Meeting of Japan Welding Society, Vol. 49, pp. 410-411, September, 1991
[Nonpatent Reference 4] "Metal Databook", edited by The Japan Institute of Metals, Third Edition, Maruzen, Mar. 25, 1993, pp. 410
[Nonpatent Reference 5] O. Kubachewski et. al., "Materials Thermochemistry", 6th Edition, Pergamon Press, pp. 258-323 (Table 1), 1993
[Nonpatent Reference 6] O. Kubachewski et. al., "Metallurgical Thermochemistry", 5th Edition, Pergamon Press, pp. 268-323 (Table A), 1979

DISCLOSURE OF THE INVENTION

Problems to be Solved by the Invention

Upon conventional solder bonding of a substrate and a device, it is preferable to melt a solder layer at the temperature of 300° C. or higher and to solder a substrate and a device for improvement of the initial bonding strength, the strength upon melting a solder layer, bonding a device, and solidifying the solder layer, but when solder bonded at the temperature of 300° C. or higher, there may be cases where thermal load to such devices as a semiconductor device and an electronic part is so high as to damage the device.

On the other hand, when solder bonded at the temperature of 300° C. or lower, the possibility is low to cause a damage to a device since the thermal load is low to a device. However, the initial bonding strength of solder bonding is weak, and the solder bonding may possibly be broken by falling or others, so that handling of the substrate with the mounted device requires care. Therefore, it is a problem to increase the strength of solder bonding in a short period.

Especially, when a device is bonded to a substrate using a solder practically not containing lead, the phase of the solder constituting the solder layer tends to be non-equilibrium, as in Nonpatent References 1 and 2, and the initial bonding strength becomes an unstable state.

Heretofore, therefore, in order to attain the initial bonding strength of a device and a substrate, a device 52 is mounted on a solder layer 51 at temperature $T_1$ before melting of the solder layer 51 formed on the not illustrated substrate, as shown in FIG. 18. A pressed state is maintained using a pressing tool 53, and the pressed state by a pressing tool 53 is maintained till solidifying of the solder layer 51 via the solder bonding temperature $T_2$, and thereby the initial bonding strength of a device 52 and a solder layer 51 was enhanced. In FIG. 18, the abscissa represents time, and the ordinate represents temperature. That is, the initial bonding strength was enhanced by making the time to press an electronic device to a solder layer long, but the distribution of the initial bonding strength was wide, bonding failure high, and hence yield was low. Also, by such a bonding method of long pressing time as mentioned above, a complex manufacturing apparatus was required for bonding many devices simultaneously.

With these problems taken into account, it is an object of the present invention to provide a solder layer that provides a high bonding strength of a device even by a simplified bonding method of a device to a substrate, a solder layer of low bonding failure, a device bonding substrate, and a method for manufacturing such a substrate.

Means for Solving the Problems

In order to attain the above-mentioned object, the solder layer of the present invention is characterized in that it is a lead free solder layer formed on a substrate, made up with a plurality of layers having mutually different phases, and oxygen content in the surface of its upper layer is less than 30 atomic % of the metal component content which is the most oxidizable among the metal components making up its upper layer.

In the above-mentioned structure, carbon content in the surface of the upper layer of the solder layer is preferably less than 10 atomic % of the metal component content which is the most oxidizable among the metal components making up its upper layer. Preferably, the solder layer has an alloy comprising gold and tin or silver and tin as a main component, and the most oxidizable metal is tin.

According to the above-mentioned structure, since it is possible to melt uniformly the solder layer surface, and it has an equilibrium state after melting and solidifying the solder layer, the initial bonding strength of the solder bonding formed with a device and a solder layer can be stabilized, as well as the failure ratio can be reduced for solder bonding.

The other constitution of the present invention is characterized in that it involves a device bonding substrate including a substrate and a lead free solder layer formed on said substrate, the solder layer made up with a plurality of layers having mutually different phases, and oxygen content in the surface of its upper layer is less than 30 atomic % of the metal component content which is the most oxidizable among the metal components making up the upper layer of the solder layer.

In the above-mentioned structure, carbon content in the surface of the upper layer of the solder layer is preferably less than 10 atomic % of the metal component content which is the most oxidizable among the metal components making up its upper layer. Preferably, the solder layer has an alloy comprising gold and tin or silver and tin as a main component, and the most oxidizable metal is tin.

According to the above-mentioned structure, a device bonding substrate can be offered which has high initial bonding strength of the solder bonding so that solder bonding failure can be reduced.

Still the other constitution of the present invention is a method for manufacturing a device bonding substrate including a substrate and a lead free solder layer formed on said substrate, characterized in that a solder layer is formed on a substrate, and thereafter thermal treatment is conducted in reducing atmosphere. The thermal treatment temperature is preferably higher than 150° C. and lower than eutectic reaction temperature. Preferably, the solder layer is separated by the thermal treatment process to a plurality of phases of a phase which begins melting at eutectic reaction temperature and a phase which does not.

According to the above-mentioned structure, a plurality of layers can be formed separately in a solder layer, the solder layer can be in the equilibrium state, initial bonding strength of a device and a solder layer is high, solder bonding failure rate can be reduced, and thereby such a device bonding substrate can be manufactured.

DESCRIPTION OF REFERENCE CHARACTERS

Figure 1:
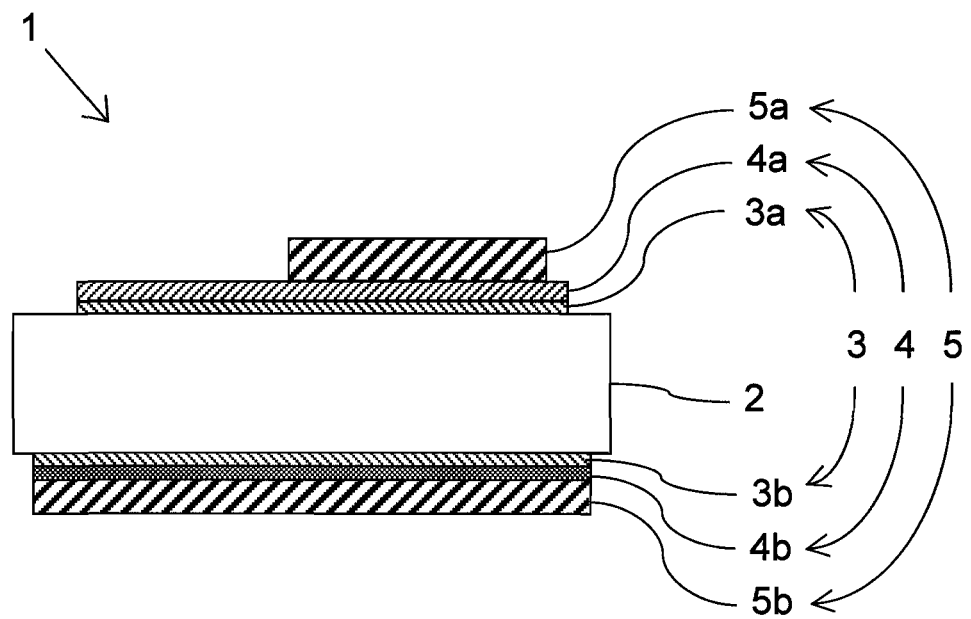
FIG. 1 is a cross-sectional view diagrammatically illustrating the structure of a device bonding substrate according to the present invention.

1, 10, 10*a*: Device bonding substrate (submount)
2: Substrate
3: Adherent layer
4, 13: Electrode layer
5, 5*a*, 5*b*, 14: Solder layer
5*c*: Solder layer on a device bonding side ($Au_5Sn$)
5*d*: Solder layer on a substrate bonding side (AuSn)
5*e*: Liquid phase
5*f*: Phase of high melt starting temperature
7, 15: Semiconductor device (device)
11: Metal substrate
12: Ceramic layer (Ceramic thin film)
15*a*: Lower electrode of semiconductor device
15*b*: Upper electrode of semiconductor device
16: Au wire
22: Pressing tool

EFFECTS OF THE INVENTION

According to the present invention, even if applied a simplified bonding method between a device and substrate using a lead free solder, a device bonding substrate and a solder layer which have high device bonding strength and low bonding failure and a method of their manufacture can be offered.

BEST MODES FOR CARRYING OUT THE INVENTION

Hereinafter, the present invention will be described in detail by the attached figures with reference to certain forms of implementation thereof. In each figure, identical or corresponding parts are indicated with same marks.

FIG. 1 is a cross-sectional view diagrammatically illustrating the structure of a device bonding substrate according to the present invention. As shown in FIG. 1, a device bonding substrate 1 is made up with an electrode layer formed on one side and/or both sides of a substrate 2, the electrode layer 4 formed on both sides of a substrate 2 in the figure, and a solder layer 5 formed in the pre-determined position of the surface of said electrode layer 4. Said solder layer 5 may be formed on the electrode layer 4 via an adherent layer 3. In the illustration, the surface side and the reverse side of the adherent layer 3 are indicated with marks 3a and 3b, respectively. Similarly, the electrode layer 4 is made up with a surface side electrode layer 4a and a reverse side electrode layer 4b, and a solder layer 5 is made up with a surface side solder layer 5a and a reverse side solder layer 5b. Here, the electrode layer 4 may be formed over the whole surface of said substrate 2, or may be formed as an electrode pattern. Also, a part of the electrode layer 4 may form an electric circuit by connecting gold wire.

As the substrate 2, such semiconductor single crystal substrate as Si and diamond IIa, such ceramic substrate as aluminum nitride (AlN) and silicon carbide (SiC) that have high thermal conductivity may be used. Also on side surfaces of the substrate 2, an electrode layer similar to those abovementioned may be formed and the upper and the lower sides of the substrate 2 may be electrically connected. As said substrate 2, such submount substrate as to mount a light emitting device such as a light emitting diode may be used.

Figure 2:
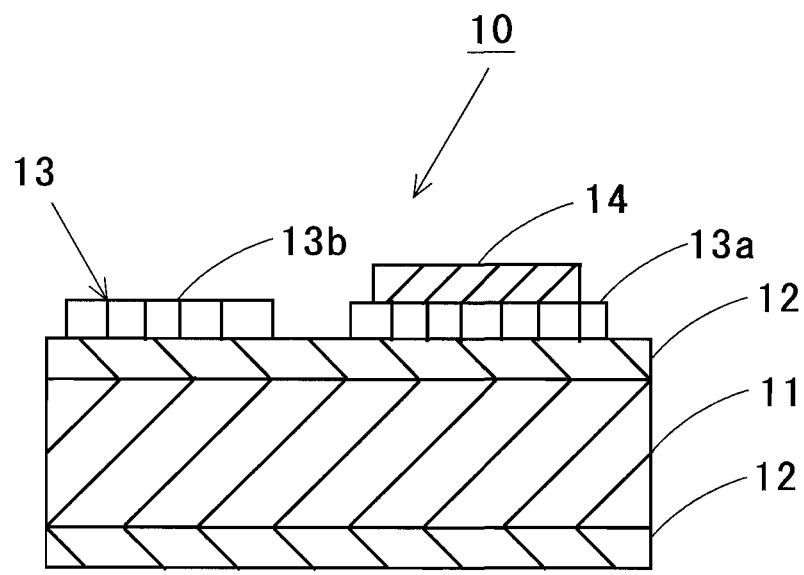
FIG. 2 is a cross-sectional view diagrammatically illustrating the structure of a second embodiment of a device bonding substrate according to the present invention.
Figure 3:
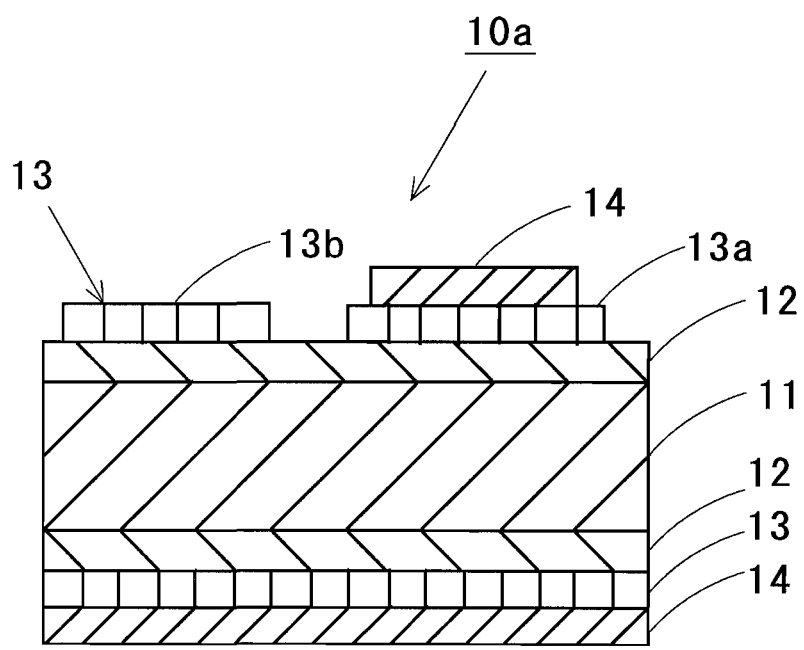
FIG. 3 is a cross-sectional view diagrammatically illustrating the structure of a third embodiment of a device bonding substrate according to the present invention.

FIGS. 2 and 3 are cross-sectional views diagrammatically illustrating the structure of a second and a third embodiment of a device bonding substrate according to the present invention. In FIG. 2, a device bonding substrate 10 is constituted as a metal-ceramic complex substrate with a metal substrate 11, ceramic layers 12, 12 formed to cover the whole metal substrate 11 on its surface and reverse sides, an electrode layer 13 formed on the surface of the ceramic layer 12 to cover a part of or the whole surface side of the ceramic layer 12, and a solder layer 14 formed in the pre-determined position 13a of said electrode layer 13 surface.

Here, as the pre-determined position 13a of said electrode layer 13, it may be the whole surface in case of a light emitting diode or the like. An electrode layer 13b without a solder layer formed may also be present. A pattern may be formed on said electrode layer 13b. In a part of said electrode layer 13b, gold wire may be connected to form an electric circuit.

An electrode layer 13 and a solder layer 14 may be formed also on the reverse side of the metal substrate 11. In case of a metal-ceramic complex substrate 10a shown in FIG. 3, an example is illustrated wherein a ceramic layer 12, an electrode layer 13, and a solder layer 14 are sequentially deposited on the reverse side of the metal substrate 11. Between said metal substrate 11 and ceramic layer 12 and/or said electrode layer 13 and solder layer 14, there may be disposed an adherent layer to enhance adhesivity upon film formation. As said adherent layer, titanium is preferred.

As said metal substrate 11, a metal-based substrate made of such metals as copper and aluminum may be used to effectively dissipate the heat generated from a device. Such a metal-based substrate preferably has a thermal conductivity of, for example, 230 W/mK or higher.

As said ceramic layer 12, a ceramic thin film of good adhesivity to a metal substrate 11, more preferably, a nitride ceramic thin film such as aluminum nitride of low thermal resistance may be used.

Two examples of device bonding substrates 1 and 10 were explained here, but not limited to said examples, it may have any structure so far as is provided with electrode layers 4 and 13, and solder layers 5 and 14 formed thereupon, and the device is connected with said solder layers 5 and 14, that is, a practical substrate.

Said electrode layers 4 and 13 are preferably of a metal, and especially any of gold (Au), platinum (Pt), silver (Ag), copper (Cu), iron (Fe), aluminum (Al), titanium (Ti), and tungsten (W) or an alloy containing any of these metals may be used. Electrode layers 4 and 13 may be formed from a multilayered film of said metals.

As said adherent layer 3, a metal is preferably used which has good adhesivity to the substrate 2 and has high melting point so that mutual diffusion with the solder layer 5 is not easily caused. As the metal material used for the adherent layer 3, a material containing as its main component any one of titanium (Ti), Cr (chromium), Ni (nickel), and Mo (molybdenum) may be used. Otherwise, it may be formed by using a material made of an alloy containing as its main component any one of Ti, Ni, Cr, or Mo. Also between the electrode layers 4 and 13, for example, a solder diffusion preventing layer made of a platinum layer may be inserted.

As said solder layers 5 and 14, a lead (Pb) free solder material is preferably used. The lead free solder layers 5 and 14 in accordance with the present invention means a solder not intentionally containing lead. As lead as a residue inevitably contained upon refining in the components of the lead free solder layer, the extent not affecting environment may be contained. As a material of solder layers 5 and 14, a solder containing two or more elements of silver, gold, copper, zinc (Zn), nickel (Ni), indium (In), gallium (Ga), bismuth (Bi), aluminum, and tin (Sn) can be preferably used.

Figure 4:
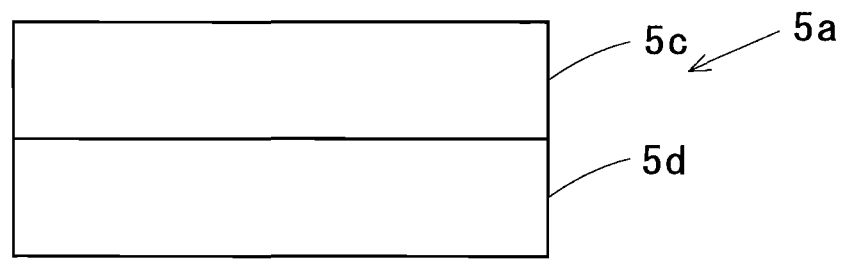
FIG. 4 illustrates diagrammatically the enlarged solder layer of the present invention.

FIG. 4 illustrates diagrammatically the enlarged solder layer 5a of the surface side of the present invention shown in FIG. 1. As shown in FIG. 4, a lead free solder layer 5a is formed with a plurality of layers 5c and 5d, and its upper layer is the layer 5c of a device bonding side and the lower layer is the layer 5d of a substrate bonding side. Each of said plurality of layers 5c and 5d has a different phase. In case that the composition of the whole solder layer 5a is Au:Sn=70:30 (weight ratio), the upper layer 5c is $Au_5Sn$, a phase melting at relatively low temperature, and the lower layer 5d is AuSn, a phase melting at relatively high temperature. When the solder layer 5a is heated over 278° C., $Au_5Sn$ phase as the upper layer 5c of the device bonding side melts first. That is, the upper layer 5c of the device bonding side of the solder layer 5a is the layer melting uniformly at relatively low temperature, thus uniform wettability can be attained.

When Au—Sn alloy is used as a material for a lead free solder layer 5a, the solder layer 5a may have a composition other than a eutectic composition, for example, Au:Sn (weight ratio)=70:30. In case that the solder layer 5a is an alloy made of Ag and Sn (Ag—Sn alloy), it is preferably possible to make the difference of the temperatures of the phases beginning to melt (hereinafter, referred to as melt starting temperature) large with, for example, Ag:Sn (weight ratio)=90:10. As will be mentioned later, by thermal treatment after film formation of a lead free solder layer 5a, it can be a plurality of layers 5c and 5d having different phases. For example, in case of Au—Sn alloy, by thermal treatment after film formation of a solder layer 5a, the layer 5c on the surface side of the solder layer becomes that consisting of Au₅Sn phase, the layer 5d on the substrate 2 side becomes that consisting of Au—Sn phase, thereby two layers 5c and 5d with different melt starting temperatures can be separated.

A mount of a semiconductor device with said device bonding substrates 1 and 10 will be explained next.

Figure 5:
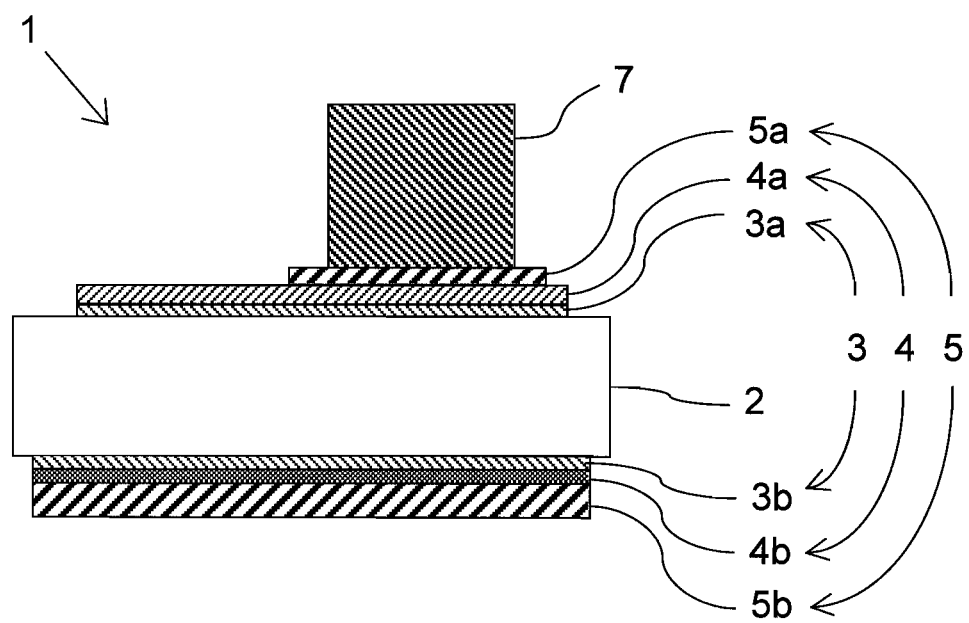
FIG. 5 is a cross-sectional view diagrammatically illustrating the structure of a semiconductor device mounted on a device bonding substrate shown in FIG. 1.

FIG. 5 is a cross-sectional view diagrammatically illustrating the structure of a semiconductor device 7 mounted on a device bonding substrate 1 shown in FIG. 1. As shown in FIG. 5, in a device bonding substrate 1, a semiconductor device 7 can be solder-bonded with a solder layer 5a on the surface side.

Figure 6:
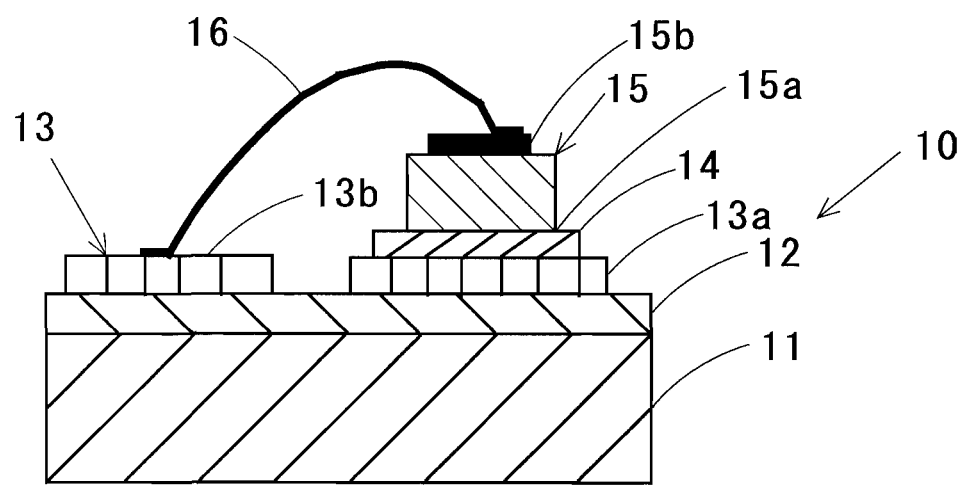
FIG. 6 is a cross-sectional view diagrammatically illustrating the structure of a semiconductor device mounted on a device bonding substrate shown in FIG. 3.

FIG. 6 is a cross-sectional view diagrammatically illustrating the structure of a semiconductor device mounted on a device bonding substrate 10 shown in FIG. 3. As shown in FIG. 6, in said device bonding substrate 10, a lower electrode 15a of a semiconductor device 15 can be solder-bonded to the device bonding substrate 10 with a solder layer 14. Also in case to use a solder layer 14 made of a widely used Au—Sn alloy, a semiconductor device 15 can be solder-bonded without flux.

On the other hand, as is illustrated, an upper electrode 15b of a semiconductor device 15 can be connected by wire bonding with Au wire 16 or else on the left hand side electrode layer 13b which is insulated from the right hand side electrode layer 13a and is formed without a solder layer.

Here, if the semiconductor devices 7 and 15 are such an active devices as a diode of light emitting devices such as laser or light emitting diodes, a transistor used for high frequency amplification or switching, and a thyristor, there may be cases where the position of pn junction as its active layer is soldered toward a heat dissipating side. In this case, a shorting failure with the active layer of the active device can be effectively prevented by making thickness of the solder layers 5 and 14 10 μm or less.

Here, semiconductor devices 7 and 15 are shown in FIGS. 5 and 6 as the mounted devices, but they may be anything so far as a so-called electronic device including a passive device, a switch, or various active devices, and a plurality of devices may be soldered to the solder layers 5 and 14 on a substrate.

Figure 7:
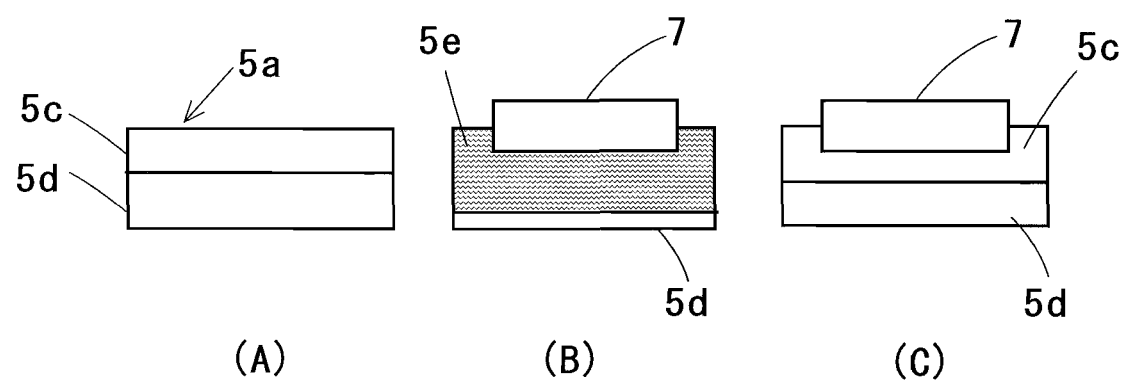
FIG. 7 is an enlarged cross-sectional view diagrammatically illustrating soldering of a device on a solder layer at respective steps of the present invention, and (A) is before melting of the solder layer, (B) is the melt soldering of the solder layer and a device, and (C) is after solidifying the solder layer, respectively illustrating soldering of a device.

FIG. 7 is an enlarged cross-sectional view diagrammatically illustrating soldering of a device 7 on a solder layer 5a of the surface side at respective steps in the present invention, and (A) is before melting of the solder layer 5a, (B) is the melt soldering of the solder layer 5a and a device 7, and (C) is after solidifying the solder layer 5a, respectively illustrating soldering of a device 7.

As is shown in FIG. 7(A), the solder layer 5a of the present invention is in an equilibrium state with two separated layers 5c and 5d of the phases of different melt starting temperatures before its melting. FIG. 7(B) shows the state of soldering temperature at which the solder layer 5a of FIG. 7(A) is heated, that is, the melting state of the solder layer 5a as a liquid phase 5e. Here, since the upper layer 5c of the solder layer on the bonding side of the device 7 is Au₅Sn phase of relatively low melt starting temperature, and the lower layer 5d of the solder layer is AuSn phase of relatively high melt starting temperature, the Au₅Sn phase 5c on the bonding side of the device 7 is first in a melting state. That is, since the Au₅Sn of relatively low melting point is separated on the upper layer 5c of the solder layer 5a of the present invention, the device bonding side can be uniformly melted. Therefore, since a uniform wettability can be maintained on the solder layer 5a, the whole bonding part of the device 7 can be soldered to the substrate 2 via the solder layer 5a. Furthermore, since only the Au₅Sn upper layer 5c of the solder layer 5a is melted and bonded, the solder layer can be maintained in an equilibrium state where two layers 5c and 5d are separated, as shown in FIG. 7(C), after the solder layer 5a is cooled and device bonded. Thus initial bonding strength can be improved.

Here, the initial bonding strength of the solder layer 5 of the present invention means the bonding strength measured within one day after bonding in the state of leaving in room temperature atmosphere of 25±10° C. after a device 7 is soldered to the solder layer 5.

Further, oxygen concentration of the bonding side of the upper layer 5c of a solder layer to a device 7, that is, the outermost layer of the upper layer 5c is preferably made 30 atomic % or less of the metal component concentration which is the most oxidizable among the main component of metals making up the upper layer 5c. The most oxidizable metal component means a metal element of the lowest standard free energy of formation (ΔG°) at 300° C. (573K) among the main component of metals making up solder.

Here, atomic % means the value calculated from the measured value of the surface of the solder layer 5 by an X ray photoelectron spectroscopy apparatus in the present invention. Data analysis is conducted such that a background is removed first, and after smoothing, peak areas are calculated with relative sensitivity correction, and atomic concentrations of oxygen and carbon normalized to the peak area of tin are calculated.

Standard free energy of formation is obtained by Equation (1) below.

[Eq 1]

$$\Delta G° = RT \ln P_{O_2} = \Delta H° - T\Delta S° \qquad (1)$$

where R is a gas constant, $P_{O_2}$ is oxygen partial pressure, $\Delta H°$ is a standard enthalpy change, $\Delta S°$ is a standard entropy change, and $\Delta H°$ and $\Delta S°$ can be obtained by equation (2) below.

[Eq 2]

$$\Delta H° = \Delta H_m + \int_{298}^{T} \Delta Cp \, dT, \quad \Delta S° = \int_{298}^{T} \frac{\Delta Cp}{T} dT \qquad (2)$$

For thermodynamic data in the equation (specific heat Cp, melting point Tm, latent heat ΔHm, standard enthalpy change ΔH° (298K), standard entropy change ΔS° (298K)), data in Nonpatent References 5 and 6 were used to calculate standard free energy of formation.

Figure 8:
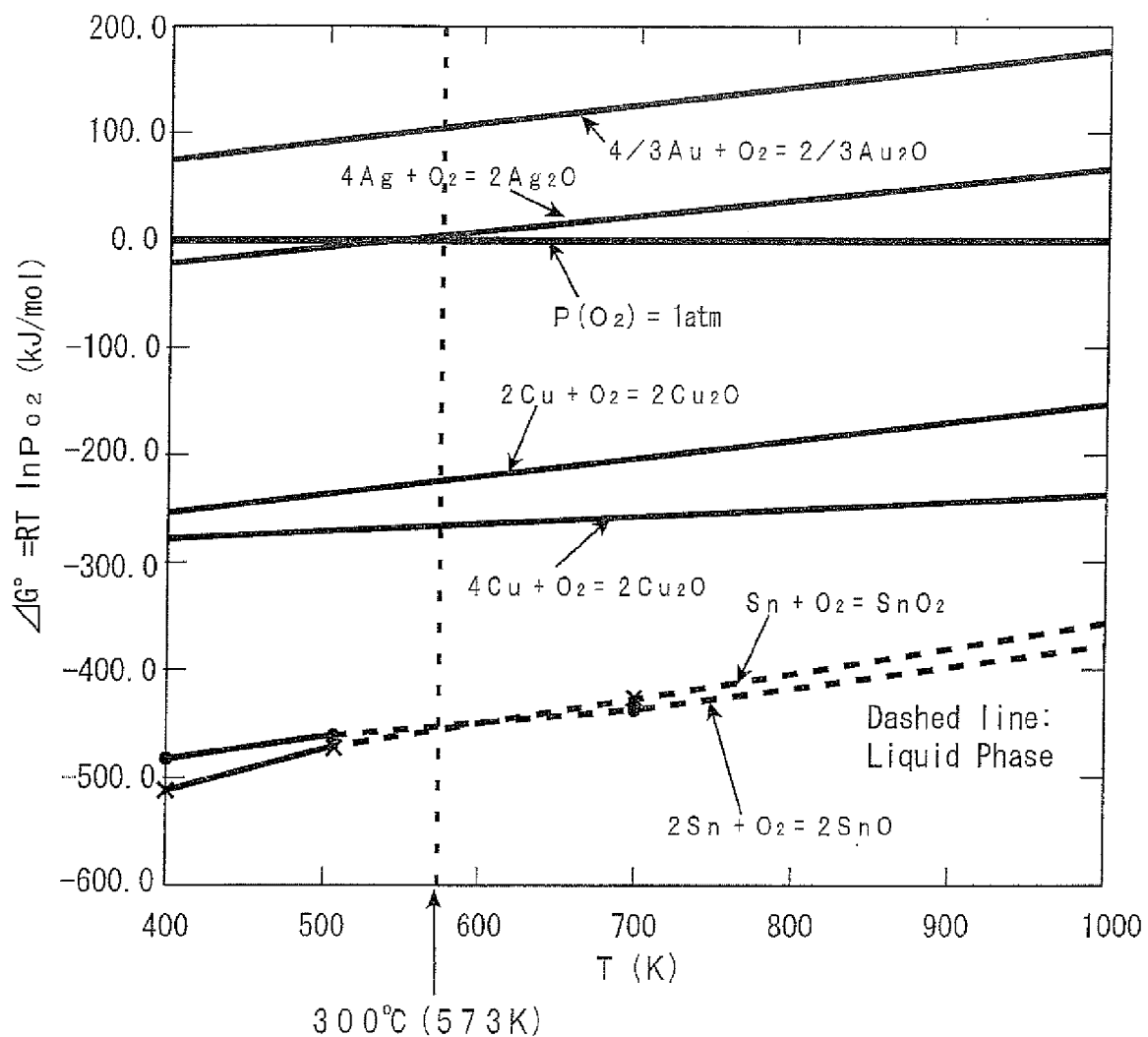
FIG. 8 is a graph showing the relationship between temperature and standard free energy of formation of Au, Ag, Cu, Sn, and P.

FIG. 8 is a graph showing the relationship between temperature and standard free energy of formation of Au, Ag, Cu, Sn, and P. This graph is a so-called Ellingham diagram. In FIG. 8, an abscissa axis represents absolute temperature (K), and an ordinate axis represents standard free energy of formation (kJ/mol). As is obvious from FIG. 8, when a solder made of Au—Sn alloy or Ag—Sn alloy is used, the most oxidizable metal component is Sn.

When the metal making up the upper layer 5c of the solder layer surface side has gold and tin or silver and tin as its main component, said oxygen concentration of 30 atomic % or lower of tin concentration enables more uniform melting of the upper layer 5c of the solder layer after thermal treatment, resulting in efficient melt reaction on the solder bonding side upon bonding.

Further, carbon concentration on the bonding side of the upper layer 5c to a device 7, that is, the outermost layer of the upper layer 5c is preferably made 10 atomic % or lower of the most oxidizable metal concentration among the main component of metals making up the upper layer 5c. When the metal making up the upper layer 5c has gold and tin or silver and tin as its main component, said carbon concentration of 10 atomic % or lower of tin concentration enables prevention of impurity contamination on the bonding side of the solder layer 5 and a device 7.

If oxygen or carbon concentrations of the upper layer 5c surface are made the above-mentioned values, then, even if melting of the solder layer 5 while a device 7 contacts the solder layer 5, that is, pressing upon device bonding is shortened to melting time of the solder layer 5, a bonding failure that initial bonding strength is 20 MPa or lower can be reduced.

By making the solder layer 5 having plural layers with different phases and further reducing carbon and oxygen concentrations on the device bonding side of said solder layer 5, productivity upon manufacture of electronic device bonding substrate 1 can be improved. Furthermore, survival rate of devices 7 in a heat cycle test after device bonding, that is, reliability upon device bonding can be improved.

Figure 9:
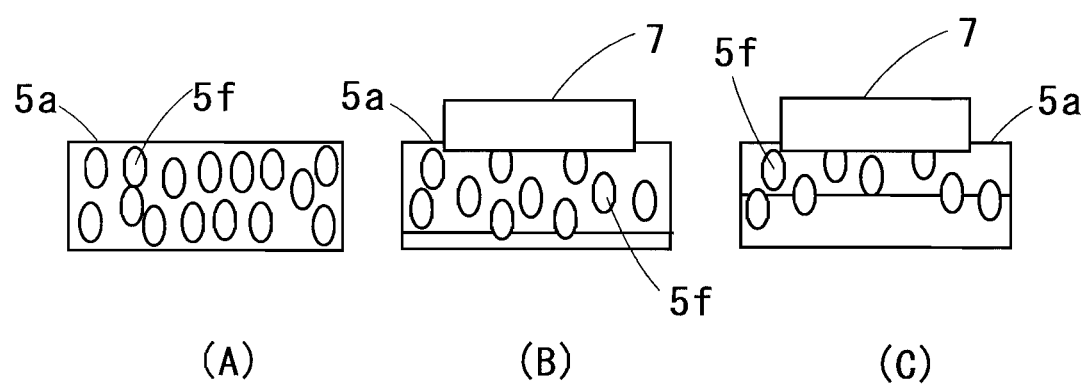
FIG. 9 is a diagrammatical enlarged cross-sectional view at each step of bonding with a solder layer when the solder layer, to be mentioned later, is not thermally treated, and (A) shows the bonding state to a device before melting of the solder layer, (B) upon melt bonding of the solder layer to a device, and (C) after solidifying of the solder layer.

FIG. 9 is a diagrammatical enlarged cross-sectional view at each step of bonding with a solder layer 5a when the solder layer 5a on the surface side, to be mentioned later, is not thermally treated, and (A) shows the bonding state to a device 7 before melting of the solder layer 5a, (B) upon melt bonding of the solder layer 5a to a device 7, and (C) after solidifying of the solder layer 5a.

When the solder layer 5a is heated to its bonding temperature shown in FIG. 9(B) from the state shown in FIG. 9(A) and melted, since the phase 5f (particulate matter in the figure) of high melt starting temperature of Au and Sn is present also near the device bonding side, a part comes out to the surface of the solder layer 5a, and the solder layer 5a on the device bonding side can not be uniformly melted. Therefore, the contact area of the melting position of the solder layer 5a and a device 7 is reduced, and bonding of a device 7 and the solder layer 5a is locally prevented, thereby good solder bonding strength can no longer be attained.

A concrete method for manufacturing a device bonding substrate will be explained here.

Figure 10:
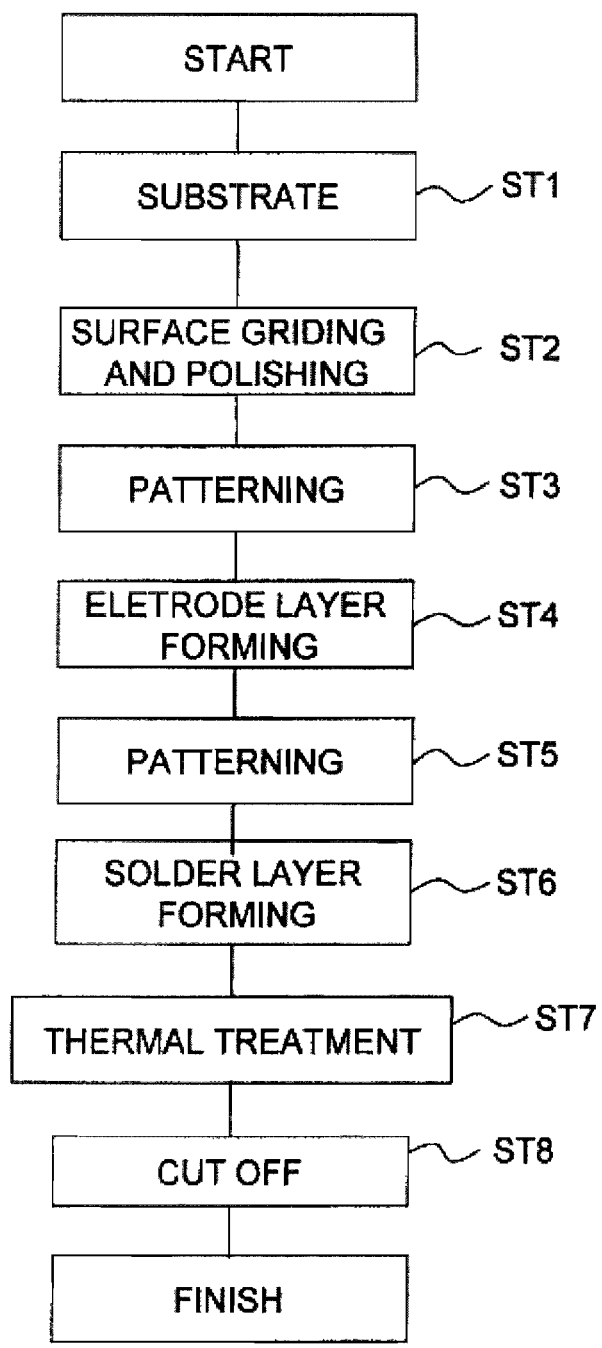
FIG. 10 is a flowchart sequentially illustrating the manufacturing steps of a device bonding substrate of FIG. 1.

FIG. 10 is a flowchart sequentially illustrating the manufacturing steps of a device bonding substrate of FIG. 1.

At Step ST1, a substrate 2 made of AlN is prepared. At Step ST2, the surface of said substrate 2 is ground and polished by the process of lapping and polishing, and at Step ST3, patterning is conducted by photolithography or the like to expose only the region where an electrode layer 4 is to be formed.

At Step ST4, an electrode layer 4 is formed on the surface of the substrate 2 by vapor deposition or others, and further by a lift-off process, only the pre-determined pattern of said electrode layer 4 is left, and other parts are removed. At Step ST5, patterning is conducted again by photolithography or the like to expose the region only where the solder layer 5 is to be formed.

Next at Step ST6, the solder layer 5 is formed on said substrate by various vapor deposition techniques, and further by a lift-off process, only the pre-determined pattern of said solder layer 5 is left and other parts are removed.

At Step ST7, thermal treatment is conducted at the pre-determined temperature for the pre-determined time by holding the whole device bonding substrate 1 in an oven or the like. More specifically, for example, at temperature higher than 150° C., at thermal treatment temperature lower than eutectic reaction temperature of the solder layer 5, thermal treatment for one hour or longer can effectively improve bonding strength. For example, when a solder made of Au—Sn alloy or Ag—Sn alloy is used, if, especially, thermal treatment temperature is 180° C. or higher, phase separation of the solder layer 5 can be accelerated. However, if thermal treatment temperature is higher than melting point, that is, if melted, it is not preferable because the solder layer can not be phase separated.

Said thermal treatment is preferably temperature controlled to maintain thermal treatment temperature at constant temperature, but thermal treatment temperature may be two steps or more. For example, the first thermal treatment temperature may be 200° C. or higher, and the next can be 250° C. Also, it may be changed continuously from the first thermal treatment temperature higher than 150° C. to the temperature region not exceeding melting point of the solder layer 5. For example, after thermal treatment at said thermal treatment temperature and once cooling to room temperature, further thermal treatment may be repeated. In this case, it may be at higher than 150° C., and thermal treatment time not exceeding melting point and lower than eutectic reaction temperature may be cumulatively one hour or longer. Thermal treatment can be conducted in a heating apparatus used for solder bonding or a heating apparatus using an electric furnace specified for thermal treatment.

The atmospheric gas for thermal treatment is preferably a reductive gas. By thermal treatment using a reductive gas, the oxidized film on the solder layer 5 surface can be reduced, oxygen contamination can be prevented inside the solder layer 5 formed upon thermal treatment, and further impurities such as carbon contamination can be prevented in the solder layer 5. Oxygen concentration in the uppermost surface of the upper layer 5c of the solder layer after thermal treatment in said reductive gas atmosphere is preferably 30 atomic % or lower of tin (Sn) concentration of the upper layer 5c. Further preferably, reductive gas concentration and thermal treatment time in reductive gas atmosphere are designed so that carbon concentration in the uppermost surface of the upper layer 5c is 10 atomic % or lower of tin concentration of the upper layer 5c. That is, reductive gas concentration in atmosphere upon thermal treatment may be designed as constant concentration from the start to finish of thermal treatment, or changed temporally so far as oxygen and carbon concentrations on the upper layer 5c surface are 30 and 10 atomic % or lower, respectively, of Sn concentration on the upper layer 5c surface.

Reductive gas may be made by mixing inert gas or others, but with diluted reductive gas concentration of 90% or higher, oxygen and carbon concentrations on the solder layer 5c surface can be reduced. It is also preferred to maintain reductive gas atmosphere from the start to finish of thermal treatment. But thermal treatment in inert gas not containing oxygen and carbon after thermal treatment for certain time in reductive gas atmosphere first, or thermal treatment in reductive gas atmosphere after thermal treatment for certain time in the atmosphere of air first might as well do. In any cases, the oxygen and carbon concentrations on the solder layer 5c surface to Sn concentration after thermal treatment should be 30 and 10 atomic % or lower, respectively. As said reductive gas, hydrogen, CO, or others may be mentioned. Especially, when hydrogen is used, oxygen and carbon concentrations on the upper layer 5c surface can be effectively reduced.

Finally at Step ST8, the above-mentioned device bonding substrate 1 is individually cut with a dicing or others, ready for shipment as a device bonding substrate product. In said method for manufacture, if the solder layer 5 is formed by vapor deposition, the device bonding substrate 1 can be preferably manufactured at low cost. However, the solder layer 5 manufactured by vapor deposition only can not be in the state where each phase is stratified as in an equilibrium state, but is a solder layer 5 in which particulate matters are dispersed like a phase 5e in which melt starting temperature of Au and Sn is high. Therefore, as in the present invention, the solder layer 5 can be separated in an equilibrium state into plural layers of the phases having different melt starting temperature, that is, it can be layer separated to the phase of relatively low melt starting temperature as the upper layer 5c of the solder layer at the device bonding side and the phase of relatively high melt starting temperature as the lower layer 5d of the solder layer by thermal treatment of the solder layer 5 formed by vapor deposition.

For mounting of a device 7 such as semiconductor device to this device bonding substrate 1, a lower electrode of the device 7, in the state of mounted on the solder layer 5 corresponding to the device bonding substrate 1, is heated. For example, in the atmosphere of air at 300° C. by lamp heating or others, so that the solder making up the solder layer 5 melts. Thereby, said solder contacts the lower electrode of the device 7 to form a so-called wet state. When heating is finished, the solder making up the solder layer 5 solidifies by cooling to room temperature, resulting in solder bonding.

Figure 11:
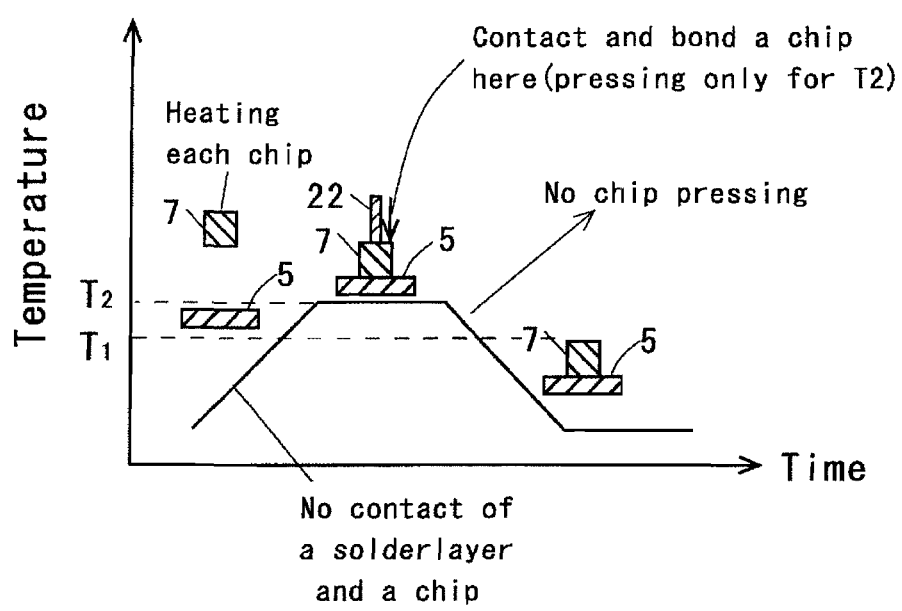
FIG. 11 is a graph diagrammatically illustrating a time chart used for solder layer bonding of a device and a solder layer in the present invention.

FIG. 11 is a graph diagrammatically illustrating a time chart used for solder layer bonding of a device 7 and a solder layer 5 in the present invention. In the figure, the abscissa axis represents time and the ordinate axis represents temperature.

As is shown in FIG. 11, it is a method which heats a solder layer 5 and a device 7 separately, mounts the device 7 on the solder layer 5 when the solder layer 5 reaches to a solder bonding temperature $T_2$, and presses with a pressing tool 22 till the solder layer 5 temperature begins to go down. In this case, since bonding failure of a device 7 and a solder layer 5 can be reduced even by shorter pressing time of the device 7, solder bonding can be conducted with a simple apparatus. Further, the productivity of device bonding substrates can be improved.

According to the device bonding substrate of the present invention, since the solder making up the solder layer 5 is in a stable state by the above-mentioned thermal treatment, the initial bonding strength is high and stable when cooled to room temperature. Therefore, the solder bonding of a device 7 can be conducted firmly. Since the bonding strength is high enough, the soldering failure is suppressed in the mounting of the device 7. The yield of the device mounting is improved, that is, the bonding failure is reduced.

In the present embodiments, the explanation was made that after the device bonding substrate 1, in which solder layer 5 was thermally treated in reductive gas atmosphere, was divided, the device 7 was bonded. Here, not limited to this case, the thermal treatment may be conducted in reductive gas atmosphere upon device bonding after division of the device bonding substrate 1 having a solder layer 5 formed, followed by bonding of a device 7.

Said device bonding substrate 1 may be constituted as a one side substrate, or an electrode layer 4b and a solder layer 5b may be disposed on the reverse side, not only on one side of the surface side of the substrate 2. Also as is necessary, an adherent layer 4 may be inserted between an electrode layer 4 and a solder layer 5.

EXAMPLE 1

Hereinafter, explanation is further made in detail of the present invention based on Examples.

Explanation is first made of the example applied to a submount 1 for a method for manufacturing a device bonding substrate 1.

Surface cleaning was conducted by cleaning both sides of a substrate 2 made of AlN, and a Ti adherent layer 3 of 0.05 μm thickness on the surface of said substrate 2, an electrode layer 4 made of 0.2 μm thick Pt and 0.5 μm thick Au on said adherent layer 3, and a solder layer 5 of 3 μm thickness and Au:Sn=70:30 (weight ratio) as a composition ratio on a part of said electrode layer 4 were formed by vacuum vapor deposition. The film forming condition is such that vacuum was $1\times10^{-4}$ Pa and the substrate temperature was 80° C.

A solder layer 5 of above processed substrate 2 was thermally treated in reductive gas atmosphere of 95% hydrogen concentration for 10 hours at 220° C. lower than eutectic reaction temperature 278° C. The submount 1 of Example 1 was manufactured from the thus processed substrate 2. Next, a tape peeling test was conducted to measure adhesive strength of the solder layer 5 of the submount 1.

The submount 1 in which solder layer was not peeled off in a tape peeling test was cut to the pre-determined shape with a dicing apparatus. A light emitting diode 7 was soldered onto the submount 1 which was cut. More specifically, the solder layer 5 of the submount 1 was lamp heated in the atmosphere of air. In this case, the rate of temperature rise was 2° C./sec till the solder layer 5 temperature rose from 240° C. to 300° C. Thereafter, when the solder layer 5 temperature reached 300° C., the bonding side of a light emitting diode 7 preliminarily heated at 150° C. was contacted to the solder layer 5, a pressure of 2N (Newton) was applied to said light emitting diode 7 to press to the solder layer 5, and held for 10 seconds. Thereafter, pressure to said light emitting diode 7 was relieved, and cooled to 240° C. at 2° C./sec to solder the light emitting diode 7 (See FIG. 10.). Here, a tape peeling test is same as the method used for adhesive strength measurement of metals in general, and a tape having a certain adhesiveness was used to evaluate peeling.

EXAMPLE 2

As Example 2, a submount 1 was manufactured with the thermally treated solder layer 5 as in Example 1 except that thermal treatment temperature was 250° C. After a tape peeling test was conducted, a light emitting diode 7 was bonded at 300° C. to the solder layer 5 of the submount 1 which showed no peeling failure. The bonding method of the light emitting diode 7 was same as in Example 1.

EXAMPLE 3

As Example 3, a submount 1 was manufactured with the thermally treated solder layer 5 as in Example 1 except that thermal treatment temperature was 180° C. After a tape peeling test was conducted, a light emitting diode 7 was bonded at 300° C. to the solder layer 5 of the submount 1 which showed no peeling failure. The bonding method of the light emitting diode 7 was same as in Example 1.

EXAMPLE 4

As Example 4, a submount 1 was manufactured with the thermally treated solder layer 5 as in Example 1 except that thermal treatment temperature was 200° C. After a tape peeling test was conducted, a light emitting diode 7 was bonded at 300° C. to the solder layer 5 of the submount 1 which showed no peeling failure. The bonding method of the light emitting diode 7 was same as in Example 1.

Comparative Examples will be explained next.

COMPARATIVE EXAMPLE 1

A submount of Comparative Example 1 was manufactured as in Example 1 except that thermal treatment temperature of the solder layer 5 was 120° C. After a tape peeling test was conducted, a light emitting diode 7 was bonded at 300° C. to the solder layer of the submount which showed no peeling failure. The bonding method of the light emitting diode 7 was same as in Example 1.

COMPARATIVE EXAMPLE 2

A submount of Comparative Example 2 was manufactured as in Example 1 except that thermal treatment temperature of the solder layer 5 was 150° C. After a tape peeling test was conducted, a light emitting diode 7 was bonded at 300° C. to the solder layer of the submount which showed no peeling failure. The bonding method of the light emitting diode 7 was same as in Example 1.

COMPARATIVE EXAMPLE 3

A submount of Comparative Example 3 was manufactured as in Example 1 except that thermal treatment temperature of the solder layer 5 was 280° C., that is, the solder layer was melted. After a tape peeling test was conducted, a light emitting diode 7 was bonded at 300° C. to the solder layer of the submount which showed no peeling failure. The bonding method of the light emitting diode 7 was same as in Example 1.

In order to investigate the bonding strength of a light emitting diode 7 and a solder layer 5, a die shear test was conducted next, and so-called chip shear strength was measured. A die shear test was conducted in accordance with MIL Standard (MIL-STD-883C, Method 2019, 4). The number of N is 100 for each condition. The chip shear strength was obtained from their average value. Bonding strength was measured with a die shear tester. More specifically, a shear tool was applied in the horizontal direction to the side perpendicular to the bonding side of a chip of the light emitting diode 7, and when moved in the horizontal direction, the load (kg) received from the chip of the light emitting diode 7 and the deviation (m) for relative movement of the light emitting diode 7 were measured after contact with the chip of the light emitting diode 7 (defined as an original point). Bonding strength τ (Pa) was calculated by (3) below from the load and the deviation obtained by said measurement.

Bonding strength τ=Load (kg)×Acceleration of gravity (m/s$^2$)/Shear area (m$^2$)     (3)

Here, shear area is the area of the side to be solder bonded, that is, the bottom side (300 μm×300 μm) of the light emitting diode 7. Shear length in the shear direction is the length in the direction perpendicular to the chip side of the light emitting diode 7 which is 300 μm.

Table 1 shows the average of 100 chip shear strengths measured by a die shear test for the bonded light emitting diode chips at various thermal treatment temperatures of the submount 1 of Examples 1-4 and Comparative Examples 1-3.

TABLE 1

| | Solder Layer Thermal Treatment Temperature (° C.) | Chip Shear Strength (MPa) (Thermal Treatment: 10 hours) |
|---|---|---|
| Example 1 | 220 | 34.1 |
| Example 2 | 250 | 31.3 |
| Example 3 | 180 | 30.2 |
| Example 4 | 200 | 31.5 |
| Comp. Ex. 1 | 120 | 23.5 |
| Comp. Ex. 2 | 150 | 24.5 |
| Comp. Ex. 3 | 280 | 12.6 |

As is apparent from Table 1, chip shear strengths of the submount 1 of Examples 1-4 are 34.1 MPa, 31.3 MPa, 30.2 MPa, and 31.5 MPa, respectively, showing that chip shear strength of 30 MPa or higher was obtained for the submount 1 thermally treated for 10 hours.

On the other hand, the chip shear strength was 23.5 MPa for the submount in Comparative Example 1 where thermal treatment temperature was 120° C. The chip shear strength was 24.5 MPa for the submount in Comparative Example 2 where thermal treatment temperature was 150° C. The chip shear strength was 12.6 MPa for the submount in Comparative Example 3 where thermal treatment temperature was 280° C.

As is apparent from these results, the initial solder strength as high as 30 MPa or higher as bonding strength can be attained by a bonding method of short pressing time by thermal treatment at temperature higher than 150° C. and lower than eutectic reaction temperature of the solder layer 5 in reductive gas atmosphere as for the submount 1 of Examples 1-4. Moreover, since said thermal treatment is conducted before mounting of a device 7, the device 7 is not thermally affected. Further, the thermal load to the device 7 is reduced upon bonding thereby resulting in improved reliability.

EXAMPLE 5

A submount 1 of Example 5 was manufactured with the thermally treated solder layer 5 as in Example 1 except that 0.2 μm thick Pt layer was inserted between an Au electrode layer 4 and a solder layer 5, and that the thermal treatment was conducted at 220° C. for 12 hours. After a tape peeling test was conducted, a light emitting diode 7 was bonded at 300° C. to the solder layer 5 of the submount 1 which showed no peeling failure. Bonding of the light emitting diode 7 was same as in Example 1.

EXAMPLE 6

A submount 1 of Example 6 was manufactured as in Example 5 except that thermal treatment of the solder layer 5 was conducted in the atmosphere of 95% carbon monoxide (CO). After a tape peeling test was conducted, a light emitting diode 7 was bonded at 300° C. to the solder layer 5 of the submount 1 which showed no peeling failure. Bonding of the light emitting diode 7 was same as in Example 1.

COMPARATIVE EXAMPLE 4

A submount of Comparative Example 4 was manufactured as in Example 5 except that thermal treatment of the solder layer 5 was conducted in the atmosphere of air. After a tape peeling test was conducted, a light emitting diode 7 was bonded at 300° C. to the solder layer of the submount which showed no peeling failure. Bonding of the light emitting diode 7 was same as in Example 1.

COMPARATIVE EXAMPLE 5

A submount of Comparative Example 5 was manufactured as in Example 5 except that no thermal treatment of the solder layer 5 was conducted. After a tape peeling test was conducted, a light emitting diode 7 was bonded at 300° C. to the solder layer of the submount which showed no peeling failure. Bonding of the light emitting diode 7 was same as in Example 1.

Figure 12:
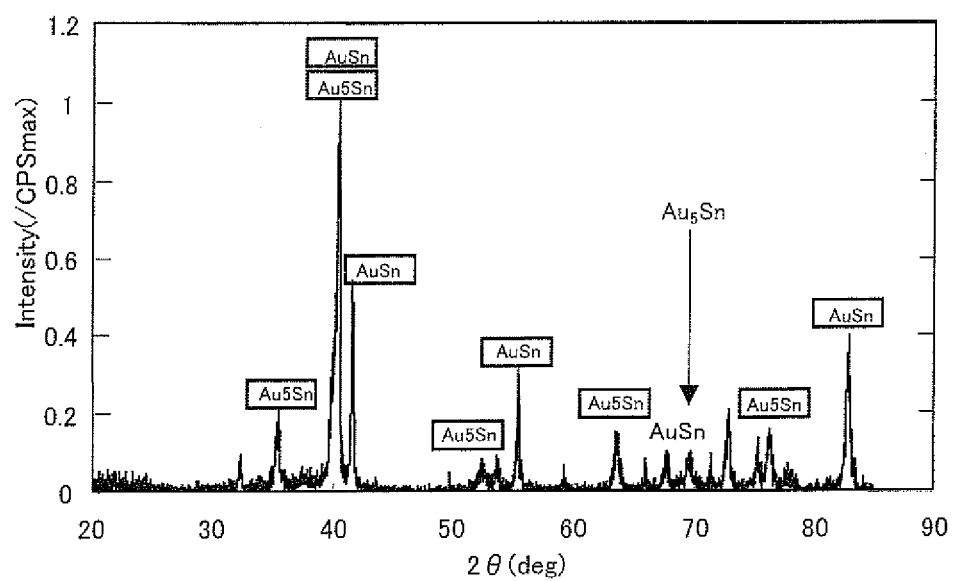
FIG. 12 is an X ray diffraction profile of a solder layer in the submount of Comparative Example 5 and Example 5, in which (A) is right after film forming by vapor deposition of a solder layer in Comparative Example 4, and (B) is after thermal treatment of a solder layer in Example 5.
Figure 12:
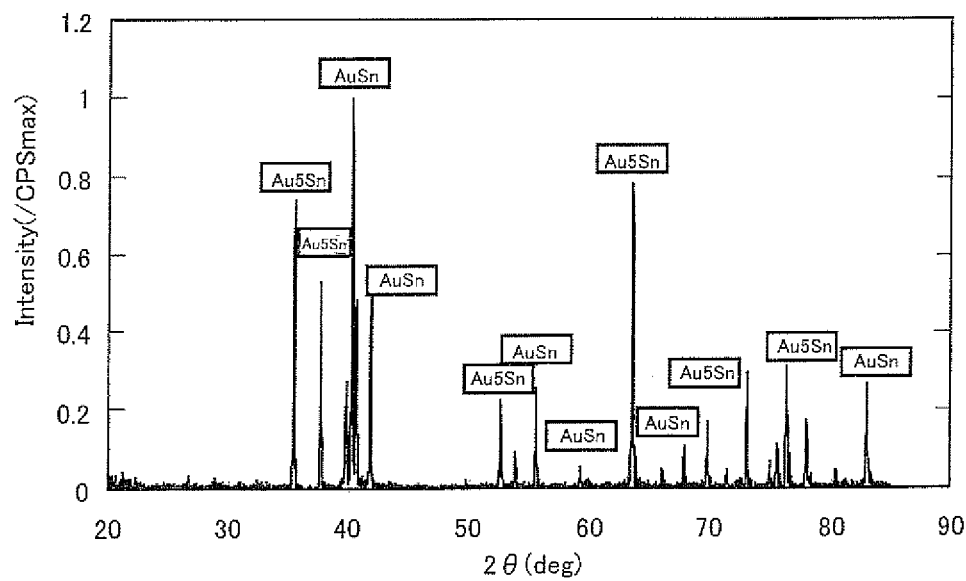

FIG. 12 is an X ray diffraction profile of a solder layer before bonding of a light emitting diode 7 in the submount of Comparative Example 5 and Example 5, that is, before melting of a solder layer, in which (A) is right after film forming by vapor deposition of a solder layer in Comparative Example 5, and (B) is after thermal treatment of a solder layer in Example 5. In FIG. 12, the ordinate axis represents X ray diffraction intensity (in arbitrary unit), and the abscissa axis represents an angle (°), that is, the angle twice of the incoming angle θ of X ray to the atomic plane. For the X ray diffraction apparatus (Rigaku Corporation, RINT-2500), an X ray source is Cu, and an accelerating voltage of electrons is 30 kV. The surface of the solder layer 5 for X ray diffraction was a bonding side to a device 7. As is obvious from FIG. 12 (A) and (B), when thermal treatment was conducted on the solder layer 5 of Example 5, it is seen that $Au_5Sn$ phase diffraction intensity increased, compared with Comparative Example 5 in which no thermal treatment was conducted to the solder layer. The X ray diffraction profile similar to Example 5 was also obtained for the samples of Example 6 and Comparative Example 4.

Figure 13:
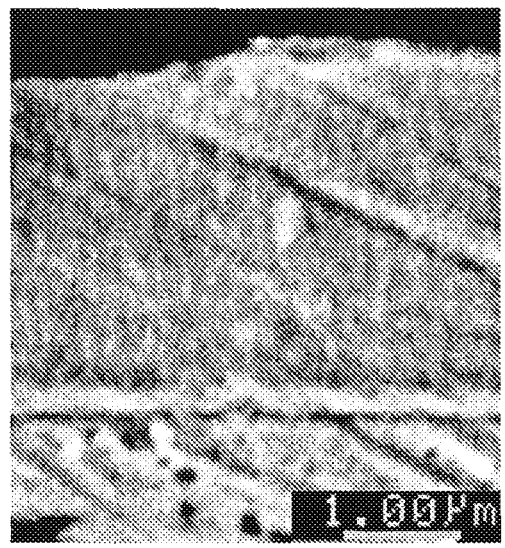
FIG. 13 is a view showing a scanning electron microscope image of a cross-section of the solder layer before thermal treatment in the submount in Example 5.

FIG. 13 is a view showing a scanning electron microscope image of a cross-section of the solder layer before melting in Comparative Example 5, that is, before thermal treatment in the submount in Example 5. Acceleration voltage of electrons was 15 kV, and magnification was ten thousand.

As is obvious from FIG. 13, particulate segregation was observed in a portion of the solder layer 5 right after vapor deposition of the solder layer 5, which implies that each phase is localized in a size of nano-meter order. As is also obvious from FIG. 13 (A), particulate distribution was confirmed for each of AuSn phase and $Au_5Sn$ phase right after vapor deposition. The cross-section of the solder layer in Comparative Example 4 in which no thermal treatment was conducted to the solder layer was similar to the cross-section of solder layer 5 before thermal treatment in said submount of Example 5.

Figure 14:
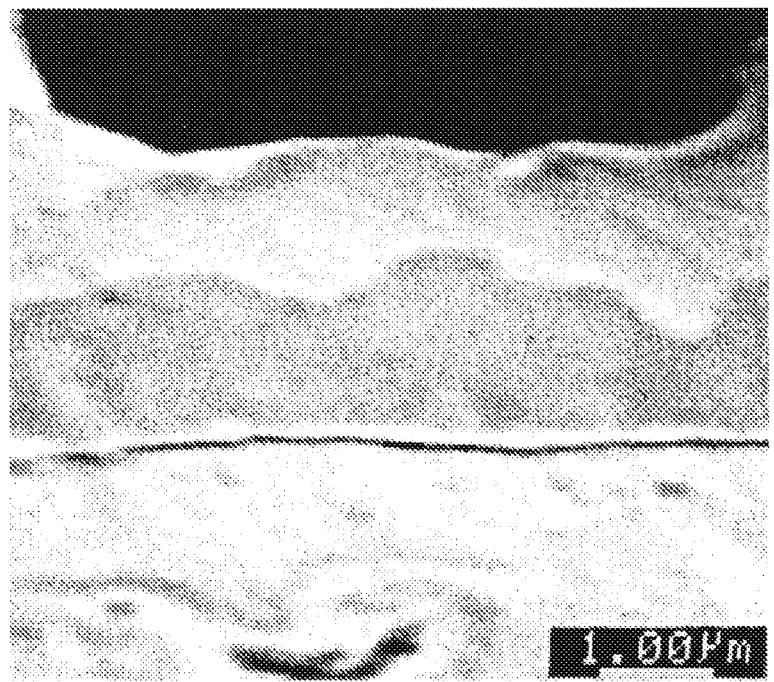
FIG. 14 is a view showing a scanning electron microscope image of a cross-section of the solder layer after thermal treatment in the submount of Example 5.

FIG. 14 is a view showing a scanning electron microscope image of a cross-section of the solder layer of the submount 1 of Example 5. The observation conditions are same as in FIG. 13. As is obvious from FIG. 14, it is seen that the solder layer 5 was separated to two layers after thermal treatment at 220° C. for 12 hours. When compared with the X ray diffraction result shown in FIG. 12(B), it is seen that $Au_5Sn$ phase was formed in a laminar mode on the surface 5c as the device bonding side of the solder layer 5, and AuSn phase was formed in a laminar mode on the substrate 2 side of the solder layer, that is, the lower layer 5d.

Figure 15:
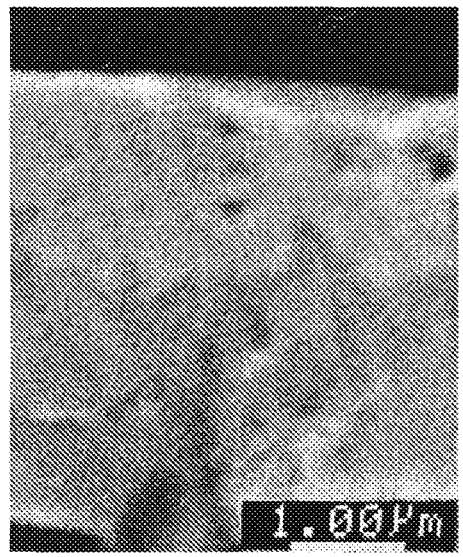
FIG. 15 is a view showing a scanning electron microscope image of a cross-section of the solder layer of the submount of Example 5 after thermal treatment, melting at 300° C., and solidifying thereafter.

FIG. 15 is a view showing a scanning electron microscope image of a cross-section of the solder layer of the submount 1 of Example 5 after thermal treatment, melting at 300° C., and solidifying thereafter. The observation conditions are same as in FIG. 13. As is obvious from FIG. 15, it is seen that the solder maintained a stable state after melting, since the solder layer 5 was phase separated to two layers as after thermal treatment on the cross-section after melting and solidifying of the solder layer 5 at 300° C. Also in Example 6 and Comparative Example 4, the solder layer 5 was phase separated to two layers by thermal treatment as in Example 5.

Figure 16:
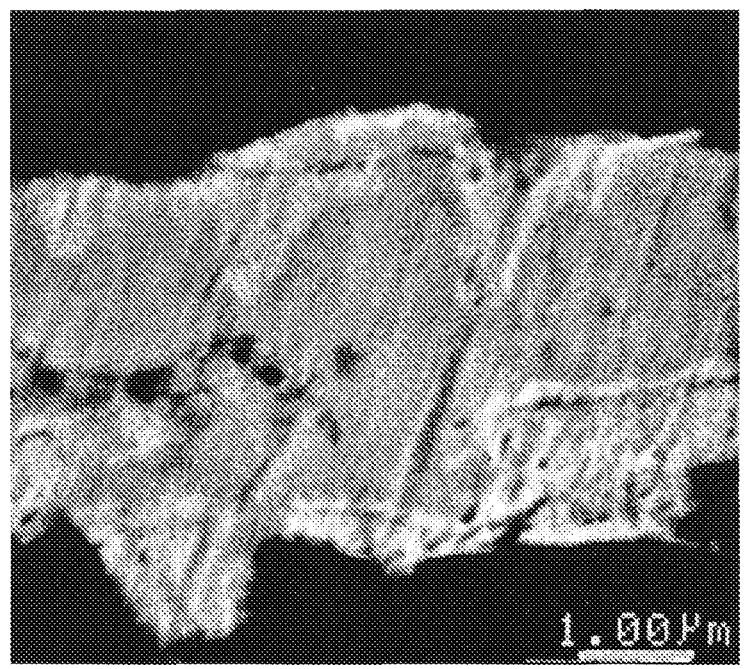
FIG. 16 is a view showing a scanning electron microscope image of a cross-section of the solder layer of the submount of Comparative Example 5 after melting at 300° C. and solidifying thereafter.
Figure 17:
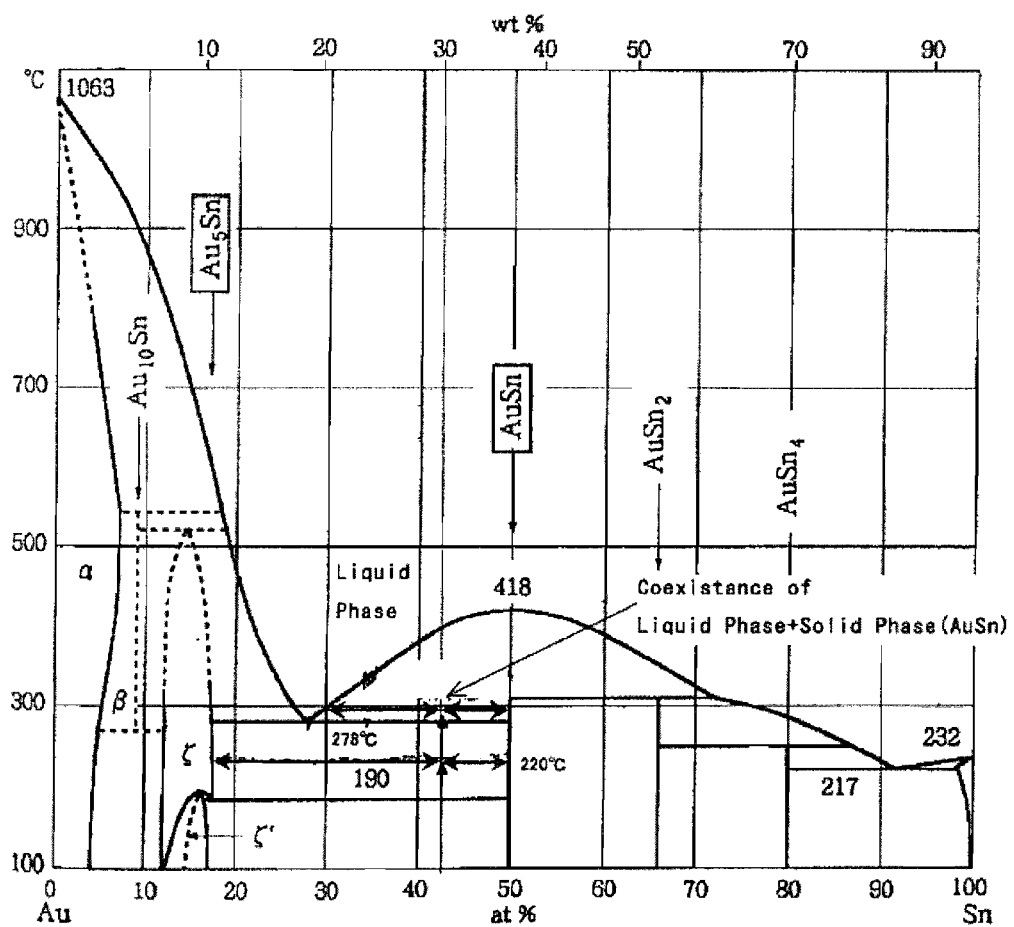
FIG. 17 is a phase diagram showing a phase by an atomic ratio of the alloy made of Au and Sn (Au—Sn alloy).
Figure 18:
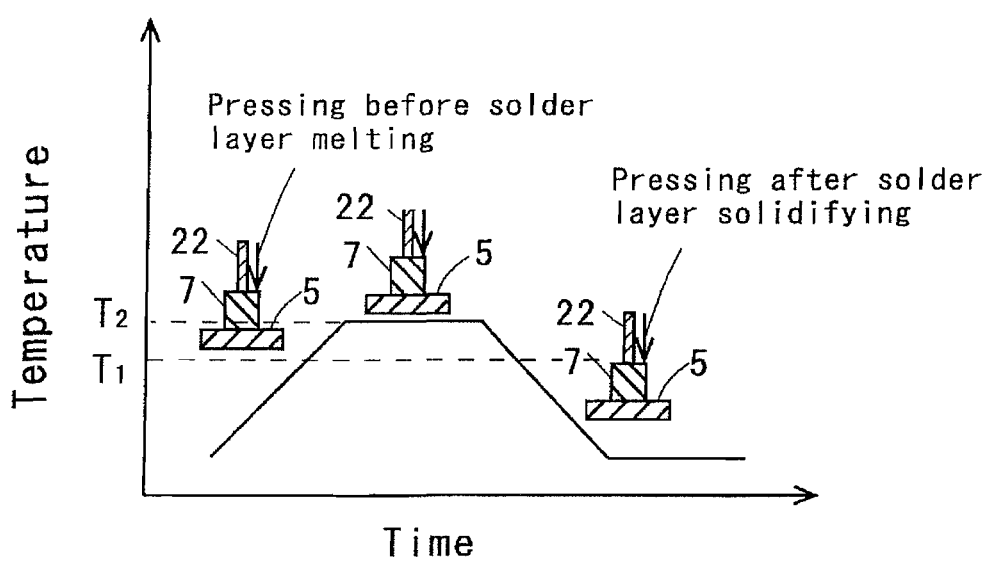
FIG. 18 is a graph diagrammatically illustrating a time chart used for solder layer bonding of a device and a solder layer in Nonpatent Reference 3.

FIG. 16 is a view showing a scanning electron microscope image of a cross-section of the solder layer of the submount 1 of Comparative Example 5 after melting at 300° C. and solidifying thereafter. The observation conditions are same as in FIG. 13. As is obvious from FIG. 16, two phases of AuSn phase and $Au_5Sn$ were confirmed similarly inside the solder layer 5 on the cross-section after melting at 300° C. and solidifying thereafter without thermal treatment, but AuSn present in the lower part of the solder layer 5 can be confirmed to protrude locally from the surface of the solder layer, and it is seen that these two phases are in the state of no phase separation in a laminar mode.

From the X ray diffraction profiles and scanning electron microscope photographs of a cross-section of Example 5 and Comparative Example 5 above, it is seen that the phase state of the solder layer 5 formed on a substrate by vapor deposition is such that each of AuSn phase and $Au_5Sn$ phase is distributing in a particulate mode. It is also seen that the solder layer 5 is not in an equilibrium state even right after melting and solidifying of these solder layers 5. On the other hand, as is obvious from FIG. 14, the solder layers 5 formed on a substrate and then thermally treated is separated to two layers of different phase states, and also separated in a laminar mode even after melting and solidifying of the solder layer 5. Thus, it is seen that layers of different phases are separated in the solder layer 5 by thermal treatment, and each phase is in an equilibrium state. Further, since a similar phase state, laminar structure, is maintained after melting and solidifying, it is seen that the upper layer 5c melts as the device bonding side of the solder layer 5.

Bonding strengths were measured for a submount substrate 1 and a device 7 in the solder layer 5 of Examples 5 and 6 and Comparative Examples 4 and 5. The average of the chip shear strengths as the bonding strengths of each submount substrate 1 and a device 7 and the bonding failure rates as the ratio of 20 MPa or lower in bonding strengths are shown in Table 2.

TABLE 2

|  | Thermal Treatment Atmosphere | Bonding Failure Rate (%) | Chip Shear Strength (MPa) | Solder Layer Surface Oxygen Conc'n. (Atomic %) | Solder Layer Surface Carbon Conc'n. (Atomic %) | Light Emitting Diode Survival Ratio (%) |
|---|---|---|---|---|---|---|
| Example 5 | $H_2$ (95%) | 0 | 34.1 | 23.7 | 6.4 | 100 |
| Example 6 | CO (95%) | 5 | 30.1 | 26.6 | 8.3 | 95 |
| Comp. Ex. 4 | Air | 25 | 23.5 | 39.3 | 13.5 | 83 |
| Comp. Ex. 5 | None | 60 | 18.1 | — | — | — |

As is obvious from Table 2, in the submount 1 having the thermally treated solder layer 5 of Examples 5 and 6 and Comparative Example 4, bonding failure rate was 0%, 5%, and 25%, respectively, which is markedly low value compared with 80% as the bonding failure of Comparative Example 5 without thermal treatment. Especially, the bonding failure rates of a submount 1 and a light emitting diode 7 in a solder layer of Examples 5 and 6 in which thermal treatment was conducted in reductive atmosphere were 0% and 5%, respectively, the further lower values than 25% as the bonding failure rate of Comparative Example 4 in which thermal treatment was conducted in the atmosphere of air, resulting in low bonding failure rate. The solder layer bonding strengths of Examples 5 and 6 were 34.1 MPa, and 30.1 MPa, respectively, and the initial bonding strength was as high as 30 MPa or higher, showing a higher value than 23.5 MPa as the bonding strength of Comparative Example 4 in which thermal treatment was conducted in the atmosphere of air.

For the submounts of Examples 5 and 6 and Comparative Example 4, oxygen concentration was measured on a solder layer surface after the solder layer thermal treatment before the light emitting diode bonding using an X ray photoelectron spectroscopy apparatus (ESCA).

The surface oxygen and carbon concentrations of the solder layer 5 shown in Table 2 are the values measured with an X ray photoelectron spectroscopy apparatus (ESCA, JEOL, JPS-9000MC) of oxygen and carbon concentrations on the outermost layer surface of the solder layer 5 before bonding of a light emitting diode 7 after thermal treatment of the solder layer 5 in the submounts 1 of Examples 5 and 6 and Comparative Example 4. K a line of Mg was used as an X ray source, and electron acceleration conditions in the X ray source was 10 kV as voltage and 20 mA as electric current. Data was obtained as a cumulative value of five scans. Analysis of data was subtracting background first, smoothing, correcting for relative sensitivity thereafter, calculating peak areas, and atomic concentrations of oxygen and carbon normalized with tin peak area were obtained.

The atomic concentrations of oxygen relative to tin concentration on the surface of solder layer 5 in Examples 5 and 6 and Comparative Example 4 were 23.7%, 26.6%, and 39.3%, respectively. Thus it is seen that, by thermal treatment in reductive gas atmosphere, oxygen concentration on the solder layer surface was reduced. Similarly, the atomic concentrations of carbon relative to tin concentration on the surface of solder layer 5 in Examples 5 and 6 and Comparative Example 4 were 6.4%, 8.3%, and 13.5%, respectively, showing the tendency similar to oxygen concentration.

From the above, it is seen that bonding with high initial bonding strength of a light emitting diode 7 to a solder layer 5 is possible even for short time solder bonding by thermal treatment of the solder layer 5 in reductive gas atmosphere before solder bonding, and thereby the yield can also be improved.

Thereby, the solder layer 5 can be separated to two layers of different phases, and oxygen and carbon concentrations on the surface of the solder layer 5c can be reduced by thermal treatment of the solder layer 5 in reductive gas atmosphere before bonding of a light emitting diode 7. In such solder bonding using the solder layer 5, it is seen that bonding with high initial bonding strength of a light emitting diode 7 and a solder layer 6 is possible, and the yield can be improved even by a solder bonding method in which a light emitting diode 7 is contacted after a solder layer 5 was melted and then the solder layer 5 is solidified.

A heat cycle test was conducted next for the light emitting diode 7 mounted on the submount 1 of Examples 5 and 6 and Comparative Example 4. The heat cycle test was such that the reverse side of the submount 1 was soldered on TO-18 stem simultaneously with the light emitting diode bonding. ETAC's heat cycle tester (Model NT510) was used, and one cycle condition was 15 minutes at 150° C. and 15 minutes at −65° C., and this was repeated. Here, during the heat cycle test, 150 mA was continuously flown in the light emitting diode. In the submount 1 of Examples 5 and 6 and Comparative Example 4, the ratio of no electric current failure in the light emitting diode after 50 heat cycle test, that is, the survival ratio (%) of the light emitting diode as the ratio of the light emitting diode 7 which showed no light emitting deterioration was shown in Table 2.

As is obvious from Table 2, survival ratios of light emitting diodes 7 after a heat cycle test in Examples 5 and 6 which conducted thermal treatment in reductive gas atmosphere were 100% and 95%, respectively, higher than 68% after a heat cycle test in Comparative Example 4 which conducted thermal treatment in the atmosphere of air.

It is seen from Examples above that the solder layer can be separated to phases having different phase state, oxygen and carbon concentrations can be reduced on the device bonding side of the solder layer, and also initial bonding strength can be enhanced and highly reliable bonding is possible even if pressing time upon bonding of a device and a substrate is made shorter.

Explanation was made of the case where a light emitting diode 7 was mounted as a device in the embodiments described above, but not limited to this, any devices such as semiconductor device having a reverse side electrode or circuit parts are applicable, and various modifications are possible within the invention recited in the claims, and needless to say that these are also included in the claims of the present invention. In the embodiments described above, a substrate 2 is made of AlN as a ceramic material, but not limited to this. Other materials may be used. Further, patterns of electrode layers 4 and 13 or solder layers 5 and 14 may be properly designed so as to have a circuit constitution of the desired purpose.

What is claimed is:

1. A method for manufacturing a device bonding substrate including a substrate and a lead free solder layer formed on said substrate, comprising:
   forming an alloy layer made of an Au-rich Au—Sn alloy having a composition other than an eutectic composition on the substrate; and
   conducting a thermal treatment to the alloy layer in reductive atmosphere
   wherein the thermal treatment is conducted at a temperature that is higher than 150° C. and lower than an Au-rich eutectic reaction temperature of the alloy layer for a prescribed duration such that the thermal treatment forms the lead free solder layer that includes:
   a lower layer over the substrate consisting of an AuSn phase; and
   an upper layer on the lower layer consisting of an $Au_5Sn$ phase.

2. The method for manufacturing a device bonding substrate as set forth in claim 1, wherein the lower layer and the upper layer do not contain a particulate distribution of the AuSn phase or the $Au_5Sn$ phase.

3. The method for manufacturing a device bonding substrate as set forth in claim 1, wherein the thermal treatment is processed at a temperature higher than 180° C. or more, and less than the Au-rich eutectic reaction temperature of the alloy layer.

4. The method for manufacturing a device bonding substrate as set forth in claim 1, wherein the alloy layer made of the Au-rich alloy has a composition of Au:Sn=70:30 in weight ratio.

5. The method for manufacturing a device bonding substrate as set forth in claim 1, wherein the prescribed duration is one hour or longer.

6. A method for manufacturing a semiconductor device including a device and a device bonding substrate manufactured by a method for manufacturing a device bonding substrate as set forth in claim 1, thereby including the method for manufacturing the device bonding substrate according to claim 1, the method for manufacturing the semiconductor device further comprising:
 heating the solder layer and the device separately;
 mounting the device on the solder layer after a temperature of the solder layer reach a solder bonding temperature in the step of heating the solder layer and the device separately; and
 soldering the device to the upper layer of the solder layer by pressing the device with a pressing tool as the temperature of the solder layer goes down.

* * * * *